United States Patent
Depew

(10) Patent No.: US 8,063,625 B2
(45) Date of Patent: Nov. 22, 2011

(54) MOMENTARILY ENABLED ELECTRONIC DEVICE

(75) Inventor: John M. Depew, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 533 days.

(21) Appl. No.: 12/141,715

(22) Filed: Jun. 18, 2008

(65) Prior Publication Data

US 2009/0315411 A1    Dec. 24, 2009

(51) Int. Cl.
*G05B 24/02* (2006.01)

(52) U.S. Cl. .......................................... 323/318

(58) Field of Classification Search ............ 323/318, 323/349–351; 361/18, 42, 55, 56, 86, 91.1; 307/125, 130, 134, 137
See application file for complete search history.

(56) References Cited

U.S. PATENT DOCUMENTS

| | | | |
|---|---|---|---|
| 3,626,408 A | 12/1971 | Carbrey | |
| 4,101,787 A | 7/1978 | Vail | |
| 4,149,162 A | 4/1979 | Enemark et al. | |
| 4,413,221 A | 11/1983 | Benjamin et al. | |
| 4,423,379 A | 12/1983 | Jacobs et al. | |
| 5,036,284 A | 7/1991 | Cichanski | |
| 5,061,898 A | 10/1991 | Oram et al. | |
| 5,185,565 A | 2/1993 | Uchida | |
| 5,268,845 A | 12/1993 | Startup et al. | |
| 5,438,270 A | 8/1995 | Harper et al. | |
| 5,477,132 A | 12/1995 | Canter et al. | |
| 5,504,415 A | 4/1996 | Podrazhansky et al. | |
| 5,623,210 A | 4/1997 | Sakamoto | |
| 5,640,079 A | 6/1997 | Nelson et al. | |
| 5,684,686 A | 11/1997 | Reddy | |
| 5,710,504 A | 1/1998 | Pascual et al. | |
| 5,831,351 A * | 11/1998 | Khosrowpour et al. | 307/139 |
| 5,852,557 A | 12/1998 | Woodward | |
| 5,912,552 A | 6/1999 | Tateishi | |
| 5,939,864 A | 8/1999 | Lenhart et al. | |
| 6,008,629 A | 12/1999 | Saeki et al. | |
| 6,057,666 A | 5/2000 | Dougherty et al. | |
| 6,061,638 A | 5/2000 | Joyce | |
| 6,064,187 A | 5/2000 | Redl et al. | |
| 6,067,241 A | 5/2000 | Lu | |
| 6,144,194 A | 11/2000 | Varga | |
| 6,229,293 B1 | 5/2001 | Farrenkopf | |
| 6,268,711 B1 | 7/2001 | Bearfield | |
| 6,307,378 B1 | 10/2001 | Kozlowski | |
| 6,313,636 B1 * | 11/2001 | Pohl et al. | 324/421 |
| 6,323,627 B1 * | 11/2001 | Schmiederer et al. | 323/222 |
| 6,326,774 B1 | 12/2001 | Mueller et al. | |
| 6,331,365 B1 | 12/2001 | King | |

(Continued)

FOREIGN PATENT DOCUMENTS

DE        19504468        8/1995

(Continued)

*Primary Examiner* — Matthew Nguyen
(74) *Attorney, Agent, or Firm* — Dorsey & Whitney LLP

(57) ABSTRACT

A circuit or apparatus for providing intermittent or interruptible power to an electronic device. The circuit may provide power upon user initiation and interrupt that power in response to a user command, fault state, period of inactivity and so forth. As one example, interruptible power may be initially provided to activate or "power up" an electronic device and constant power provided after the initial activation. The initial powering up of the device may be facilitated by closing two contacts. The circuit may continue to provide power after the button is released through a monitoring and/or feedback mechanism.

7 Claims, 3 Drawing Sheets

U.S. PATENT DOCUMENTS

| | | |
|---|---|---|
| 6,337,560 B1 | 1/2002 | Kalogeropoulos et al. |
| 6,366,070 B1 | 4/2002 | Cooke et al. |
| 6,400,123 B1 | 6/2002 | Bean et al. |
| 6,507,168 B1 | 1/2003 | Matsuda et al. |
| 6,534,993 B2 | 3/2003 | Bertness |
| 6,548,755 B2 | 4/2003 | Wu |
| 6,583,606 B2 | 6/2003 | Koike et al. |
| 6,661,116 B1 | 12/2003 | Seto |
| 6,677,734 B2 | 1/2004 | Rothleitner et al. |
| 6,683,441 B2 | 1/2004 | Schiff et al. |
| 6,762,563 B2 | 7/2004 | St. Germain et al. |
| 6,771,046 B2 | 8/2004 | Ariga et al. |
| 6,809,504 B2 | 10/2004 | Tang et al. |
| 6,836,157 B2 | 12/2004 | Rader et al. |
| 6,914,412 B2 | 7/2005 | Wang et al. |
| 6,947,178 B2 | 9/2005 | Kuo et al. |
| 6,980,912 B2 | 12/2005 | Patino et al. |
| 7,012,402 B2 | 3/2006 | Miller et al. |
| 7,078,908 B2 | 7/2006 | Fujita et al. |
| 7,157,888 B2 | 1/2007 | Chen et al. |
| 7,191,077 B2 | 3/2007 | Mese et al. |
| 7,216,044 B2 | 5/2007 | Kato et al. |
| 7,242,169 B2 | 7/2007 | Kanamori et al. |
| 7,259,538 B2 | 8/2007 | Melton et al. |
| 7,266,001 B1 | 9/2007 | Notohamiprodjo et al. |
| 7,274,112 B2 | 9/2007 | Hjort et al. |
| 7,282,891 B2 | 10/2007 | Smallwood et al. |
| 7,388,349 B2 | 6/2008 | Elder et al. |
| 7,570,015 B2 | 8/2009 | Bansal et al. |
| 7,646,620 B2 | 1/2010 | MacDonald et al. |
| 7,688,029 B2 | 3/2010 | Hoffman |
| 7,702,178 B2 | 4/2010 | Bergen et al. |
| 2003/0015993 A1 | 1/2003 | Misra et al. |
| 2005/0077875 A1 | 4/2005 | Bohley |
| 2005/0258941 A1 | 11/2005 | Berard |
| 2005/0266300 A1 | 12/2005 | Lamoreux et al. |
| 2006/0174141 A1 | 8/2006 | Chang |
| 2007/0091187 A1 | 4/2007 | Lin |
| 2007/0114968 A1 | 5/2007 | Krah et al. |
| 2008/0090133 A1 | 4/2008 | Lim et al. |
| 2009/0059255 A1 | 3/2009 | Ohide |
| 2009/0208824 A1 | 8/2009 | Greening et al. |
| 2009/0261653 A1 | 10/2009 | Furukawa et al. |
| 2009/0289603 A1 | 11/2009 | Mahowald |
| 2009/0309552 A1 | 12/2009 | Krah et al. |
| 2010/0027906 A1 | 2/2010 | Hara et al. |
| 2011/0074360 A1 | 3/2011 | Kerr et al. |
| 2011/0074434 A1 | 3/2011 | Staton |

FOREIGN PATENT DOCUMENTS

| | | |
|---|---|---|
| EP | 1961621 | 8/2008 |
| FR | 2090074 | 1/1972 |
| GB | 2046923 | 11/1980 |
| GB | 2275118 | 8/1994 |
| WO | WO2008/075358 | 6/2008 |

* cited by examiner

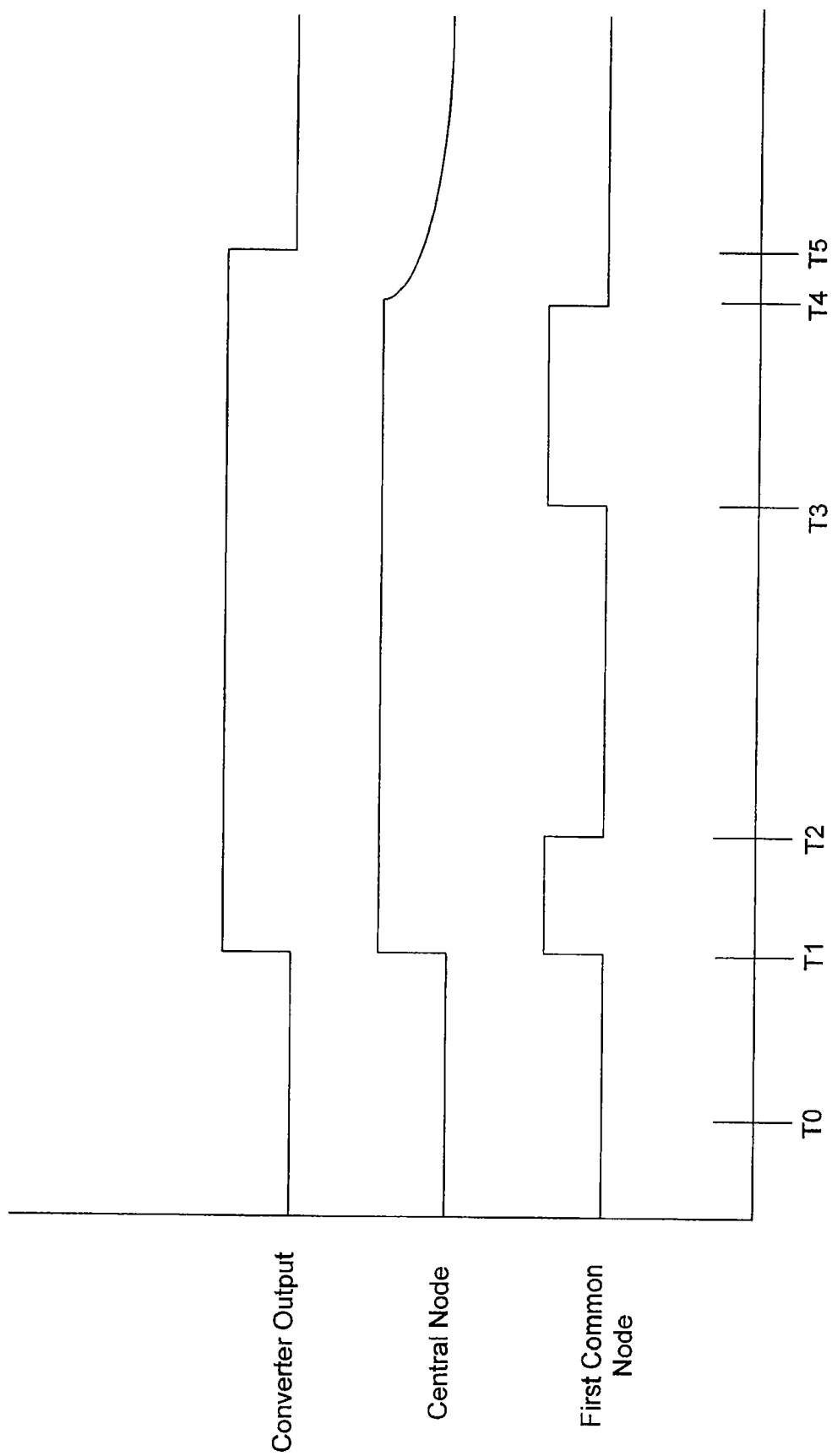

MOMENTARILY ENABLED ELECTRONIC DEVICE

BACKGROUND OF THE INVENTION

1. Technical Field

This invention relates generally to power control for an electronic device, and more particularly to a control mechanism providing momentary power and constant power states.

2. Background Discussion

Modern electronic devices may be activated in any number of ways. Some devices may use switches having an on and off position. Others may use buttons that may be pressed down to activate an operational state and depressed to exit the operational state (or vice versa). Still others may use sliders, microswitches and so forth. Typically, such devices require the activating element to travel between an "on" and "off" position and maintain the position selected. Thus, during the entire time the device is active, the activating element maintains its "on" position.

Should the activating element become stuck or the device inadvertently be left on, the device may remain on until its power source is drained. If the device is battery-powered, this may lead to the replacement of removable batteries, shortening of the life of rechargeable lithium-ion batteries as a charge cycle is consumed, and/or the necessity of recharging the device before it may be used again. Further, certain electronic devices may pose a safety hazard if they are constantly operated for an excessive time. For example, the device may become hot to the touch or may cause deep discharge of a battery, thereby leading to a corrosive acid leak.

Further, many electronic devices employ an activation mechanism solely to cycle the device between its powered and depowered states. Additional controls may be used to manage device functionality. The use of multiple controls not only may affect the aesthetic of a given electronic device but also increase its operational complexity and thereby the chance for user error.

BRIEF SUMMARY

Generally, one embodiment of the present invention may provide intermittent or interruptible power to an electronic device. The embodiment may provide power upon user initiation and interrupt that power in response to a user command, fault state, period of inactivity and so forth. As one example, interruptible power may be initially provided to activate or "power up" an electronic device and constant power provided after the initial activation.

The initial powering up of the device may be facilitated by closing two contacts, for example by pressing a button. The embodiment may continue to provide power after the button is released through a monitoring and/or feedback mechanism. As one example, a microcontroller may monitor a status of the button (e.g., open or closed) and a status of a power converter's power output. Presuming the button is open and the power output is active, the microcontroller may energize a transistor to close a feedback path that, in turn, maintains the power converter in an active state.

Certain embodiments may provide additional functionality. For example, the switch, button, or other element used to provide interruptible power may initiate different functions when pushed, held closed or otherwise activated for a set period of time. Continuing the example, a button may provide interruptible power to start up or activate an electronic device when pressed and released; the same button may initiate a shutdown or deactivation sequence if pressed and held for at least a minimum time. As yet another example, if pressed multiple times in succession within a sufficiently short time, the button may control some function of the electronic device such as brightness, volume, transmission strength and so on.

One embodiment takes the form of an apparatus for transmitting power, including: a power input; an activating element connected to the power input; a power converter comprising a first input, second input and output, the power converter connected to the power input at the first input; a voltage source connected to the second input by a central node; and a gate device connected between the output and the central node.

Another embodiment takes the form of a method for supplying power, including the operations of: closing a contact; in response to closing the contact, activating a power converter; in response to activating the power converter, supplying an output voltage; raising a voltage of a node above a shutdown voltage; and maintaining the output voltage so long as the node voltage exceeds the shutdown voltage.

Still another embodiment takes the form of a method for supplying power to a device, including the operations of: detecting a button has been pressed; detecting an output voltage from a power converter; detecting the button has been released; and, in response to detecting the button has been released and detecting the output voltage, supplying a base voltage to a base of a transistor, thereby creating a current path through the transistor and maintaining the output voltage of the power converter.

BRIEF DESCRIPTION OF THE FIGURES

FIG. 3 is a state diagram depicting the voltages of various nodes and/or elements of the embodiment of FIG. 2 at varying times.

DETAILED DESCRIPTION

I. Introduction

Generally, one embodiment of the present invention takes the form of a device, such as a circuit, providing interruptible power to an electronic device. Further, in addition to providing interruptible power, the device may also provide uninterrupted power under certain circumstances. As one example, interruptible power may be initially provided to activate or "power up" an electronic device and constant power provided after the initial activation.

As used herein, "interruptible power" generally refers to power that is momentarily provided rather than constantly provided. Thus, after some period, the power supply contact or circuit may be broken or opened to suspend power. In other words, "interruptible power" is essentially transient power. Interruptible power may be supplied by closing contacts via a switch or button, for example.

Certain embodiments may provide additional functionality. For example, the switch, button, or other element used to provide interruptible power may initiate different functions when pushed, held closed or otherwise activated for a set period of time. Continuing the example, a button may provide interruptible power to start up or activate an electronic device when pressed and released; the same button may initiate a shutdown or deactivation sequence if pressed and held for at least a minimum time.

II. Sample Operating Environment

Figure 1:
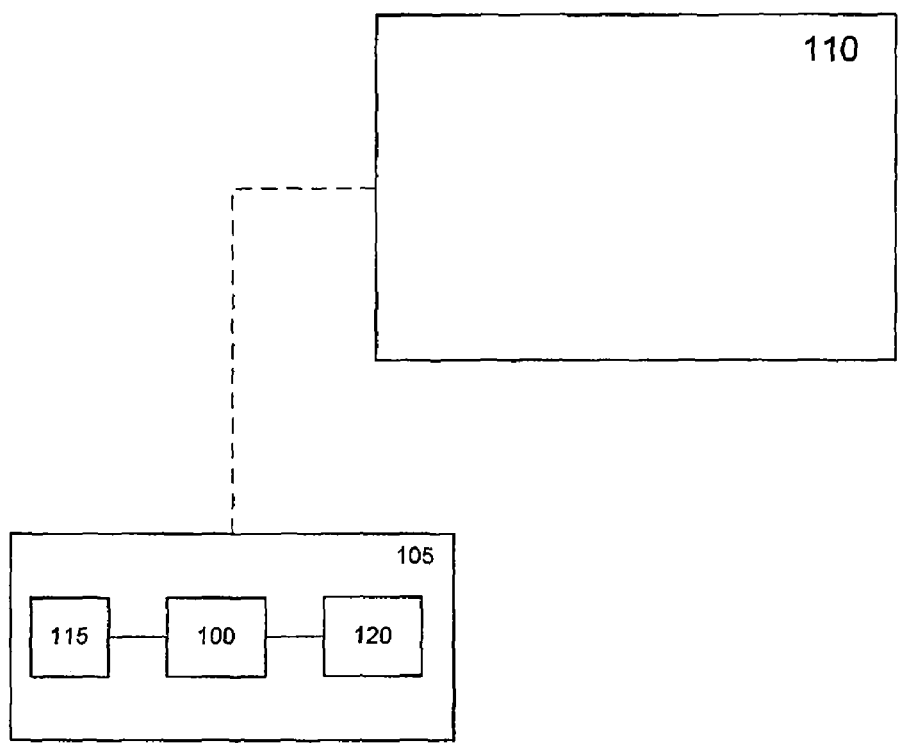
FIG. 1 depicts a sample operating environment for an embodiment of the present invention.

FIG. 1 depicts one sample operating environment for an exemplary embodiment. The embodiment 100 may be contained in, for example, a wireless keyboard 105 in communication with a computer 110. The keyboard 105 may include a power source, such as a battery 115. The battery may be connected to the embodiment.

The keyboard 105 may further include operational circuitry 120. As one example, operational circuitry 120 may include a processor for receiving and interpreting keystrokes or other input, a wireless transmitter to convey data to the computer 110, a wireless receiver to receive data from the computer and so forth. The operational circuitry may be powered by the battery 115. However, maintaining the operational circuitry in a constantly-powered mode may rapidly drain the battery charge, thus leading relatively quickly to inoperability of the keyboard 105. Accordingly, the embodiment 100 may provide power to the operational circuitry 120 only under certain circumstances, such as when a power button is pressed or a power switch closed. Pressing the button or flipping the switch a second time may initiate a shutdown sequence that prevents power from flowing from the battery to the operational circuitry.

It should be noted that the embodiment 100, or alternative embodiments, may be used in any number of electronic devices and not just the keyboard 105 depicted in FIG. 1. For example, portable computing devices, portable digital storage devices, media players, mobile telephones, and so on all may incorporate an embodiment. Further, the operational circuitry 120 need not provide any particular functionality (such as the wireless communication capabilities discussed with respect to FIG. 1) but merely some functionality that draws power from the battery 115 at least under certain circumstances.

III. Sample Embodiment

Figure 2:
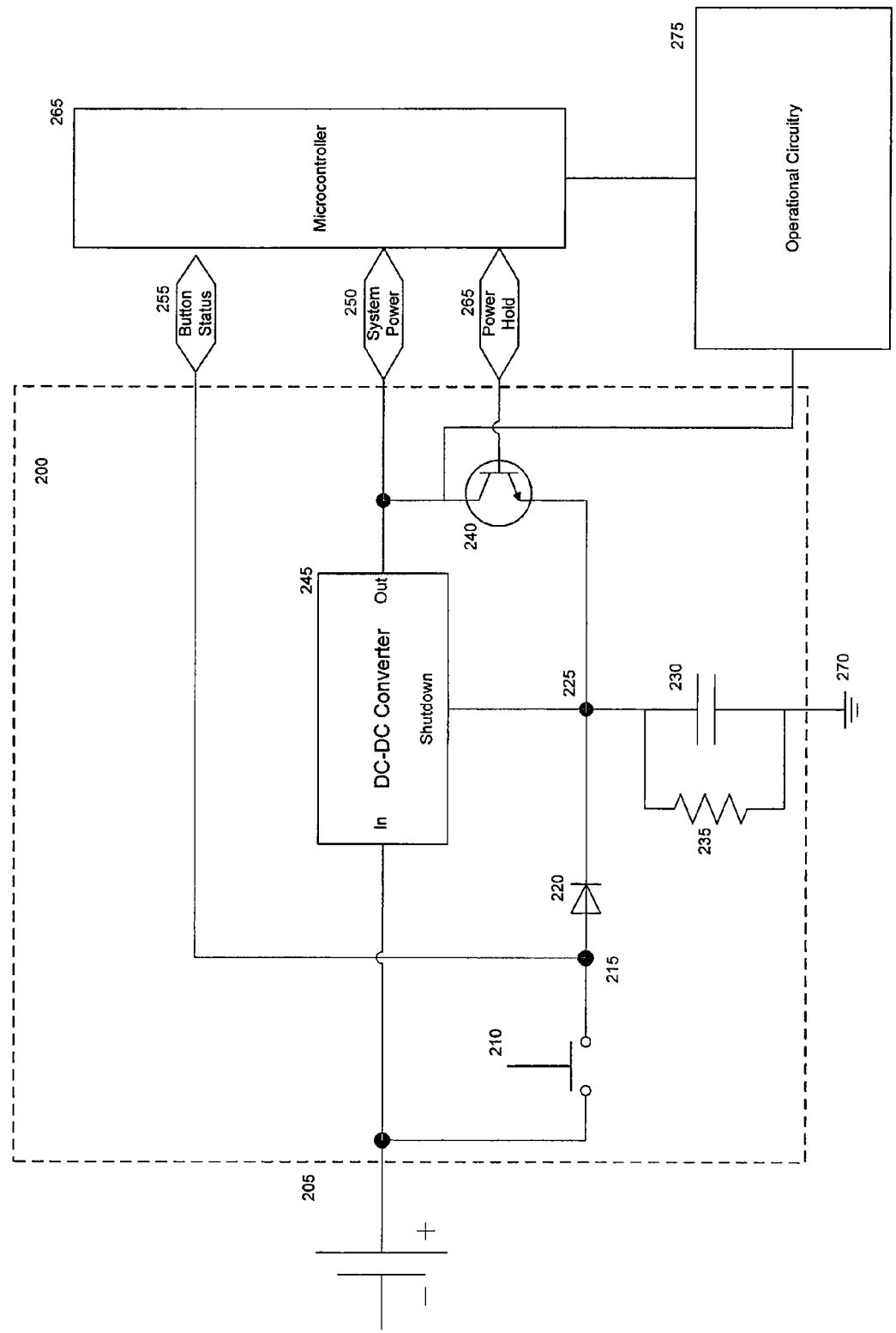
FIG. 2 depicts a first embodiment of the present invention.

FIG. 2 depicts one sample embodiment 200. The embodiment 200 may be electrically and/or operationally connected to a battery 205, much as shown in the exemplary operating environment of FIG. 1. The embodiment may also include a transient connector 210, such as a switch, button or other element that may selectively close or open an electrical path across the connector. In the embodiment 200 shown in FIG. 2, the transient connector 210 is a push button. Accordingly, the remainder of this document will generally discuss the operation of the button 210 as it pertains to the overall operation of the embodiment. However, it should be noted that the term "button" is intended to encompass any form of transient or temporary connector or activating element, specifically including the aforementioned switch.

A first contact of the button 210 is electrically connected to the battery 205 and a second contact of the button 210 is electrically connected to a first common node 215. Likewise, an anode of a diode 220 is electrically and/or operationally connected to the first common node 215. The cathode of the diode 220, in turn, is electrically connected to a central node 225. (For simplicity's sake, the term "connected" as used herein shall be construed to encompass both "operationally connected" and "electrically connected," unless such construction would render the sentence, embodiment or disclosure meaningless, unpatentable or inoperable.)

The central node 215 is additionally connected to a capacitor 230, resistor 235 and emitter of a NPN-doped bipolar junction transistor (BJT) 240. Although FIG. 2 depicts a BJT 240, it should be readily understood that any other form of transistor may be used in lieu of the BJT. Likewise, any such transistor may be either a NPN or PNP doped transistor with appropriate changes to the orientation and connections of the embodiment 200. The BJT 240 includes three terminals, namely a base, collector and emitter. The central node 215 is also connected to a shutdown input of a DC to DC converter 245. The function of the converter 245 is discussed in more detail below.

The DC to DC converter 245 likewise has a power input and a power output. The converter's power input is connected to the battery 205 via a power input (and thus to the first contact of the button 210, as shown in FIG. 2). The converter's output is connected in turn to the collector of the BJT 240 and to a system power input 250. The function of the system power input 250 is discussed in more detail later.

The first common node 215 is also connected to a button status input 255, which is likewise discussed below. A power hold control output 260, also discussed below, is connected to the base of the BJT 240.

In the present embodiment, a microcontroller 265 may accept and/or transmit signals from and to the embodiment 200, respectively. The microcontroller 265 may monitor and/or coordinate operation of both the operational circuitry 275 and the embodiment. For example, if the embodiment 200 is installed in a wireless device, the microcontroller 265 may act as an interface between a wireless transmitter (and associated circuitry) and the embodiment. The microcontroller may further control the operational circuitry. Continuing the prior example, the microcontroller may determine when and how the wireless transmitter transmits data. In the system shown in FIG. 2, the microcontroller 265 includes the aforementioned button status input 255, system power input 250 and power hold control output 260.

The aforementioned capacitor 230 and resistor 235 are connected between the central node 225 and a ground 270.

IV. Microcontroller Inputs and Output

Generally, the button status input 255 permits the microcontroller 265 to monitor whether the button 210 is pressed or free. The button, when pressed, bridges the first contact and the second contact and creates an electrical path between the battery 205 and first common node. Accordingly, if the button is pressed the voltage at the first common node 215 is equal to the battery voltage. When the button is free and therefore not bridging the contacts, the voltage of the first common node is roughly or exactly zero. Since the button status input 255 is connected to the first common node 215, its voltage equals that of the first common node.

Thus, when the button 210 is pressed, the voltage of the first common node 215 and associated button status input 255 rise above a default or threshold value (e.g., goes "high"). This threshold value may be, for example, zero. Accordingly, in the status input 255 voltage is high, the microcontroller may presume the button is being pressed.

The system power input 250 monitors the output of the DC to DC controller 245. If the output voltage is high (e.g., the converter is operating), then the system power input is high. This, in turn, indicates to the microcontroller that the embodiment 200 is operating to supply power to the microcontroller 265 and operational circuitry. Indeed, the system power input 250 generally provides operating power for the microcontroller 265 and operational circuitry and thus the monitoring function may be considered secondary. In alternative embodiments, the system power input 250 may be used for monitoring only and a separate electrical connection from the output of the controller 245 may provide power to the microcontroller and/or operational circuitry.

The power hold control output 260 generally is an output of the microcontroller 265. Voltage may be applied to the base of the BJT 240, thereby permitting current flow from the collector to the emitter of the BJT. In other words, a sufficient voltage outputted at the power hold control output 260 permits current flow between the output of the converter 245 and the central node 225, and ultimately through the capacitor 230 and to the ground 270. Thus, when the BJT is energized by the power hold control output signal, the voltage of the central node 225 is approximately the voltage of the converter output (less any voltage drop across the BJT itself) and the capacitor may obtain or maintain a charge.

V. The DC to DC Converter

The DC to DC controller 245 generally converts the input voltage of the battery, as received at the converter's input terminal, to a constant DC output voltage expressed at the converter's output terminal. In the present embodiment 200, the output voltage is regulated to 3.3 volts. It should be appreciated that the actual regulated value of the converter's output voltage may vary depending on the electronic device in which the embodiment 200 is housed, the power consumption of the operational circuitry and/or microprocessor and so on.

Additionally, it should be noted that the DC to DC controller 245 only operates if the voltage received at its shutdown input exceeds a minimum voltage. In the present embodiment, the minimum voltage is 0.4 volts. Since the shutdown input is tied directly to the central node 225, the controller 245 operates only when the central node's voltage exceeds the minimum value. It should be noted that alternative embodiments or implementations may employ a different minimum voltage.

When the shutdown input voltage is below the minimum voltage, the battery is still electrically connected to the input terminal of the controller 245. However, the controller 245 itself floats the input terminal such that no current path exists between the input terminal and the output terminal. Thus, the controller 245 does not draw any battery power if the shutdown input voltage is below the minimum threshold.

When the shutdown input voltage exceeds the minimum threshold, the controller 245 activates as accepts an input at its input terminal. Accordingly, the battery power is accessed and accepted by the controller 245 in order to provide the aforementioned regulated output voltage (and therefore a regulated DC output current) at its output terminal.

Given the foregoing, it can be recognized that the voltage at the central node 225 controls whether or not the controller 245 operates, and thus whether the battery power is drained since the battery power generally is not employed by the embodiment 200, microcontroller 265 or operational circuitry unless the controller 245 is in an operating mode. The next section of this discussion deals generally with operation of the embodiment 200 as well as the manner in which the embodiment sets the voltage at the central node 225.

The exact make and model of the DC to DC controller 245 may vary from embodiment to embodiment, as is the case with all elements of the embodiment. Any commercially available converter with the operational characteristics and appropriate inputs/outputs described herein may be employed. It should also be noted that power generally does not "leak" through the system when the central node voltage is below the shutdown input voltage (e.g., the controller 245 is off). Further, the controller 245 generally has a relatively low quiescent power consumption when the embodiment 200 is inactive, although the exact definition of "low quiescent power consumption" may vary in different embodiments, with respect to the supply voltage of the battery, and so on.

VI. Operation of the Sample Embodiment

Operation of the embodiment 200 will now be discussed with respect to FIGS. 2 and 3. For purposes of this discussion, presume the battery holds a charge above a threshold value. In this example, the threshold value is 0.4 volts, but the threshold may vary in alternative embodiments or implementations.

FIG. 4 generally depicts the voltage levels of the first common node 215, central node 225 and DC to DC converter output/system power input 250 at various times during operation of the embodiment 200. Events occurring at each of the times T0, T1, T2, T3, T4, T5 and T6 are described below, as are the various voltages and operation of the embodiment at each time.

Initially, at time T0 the button is not pressed; this is analogous to an initial off state for the embodiment 200. The battery 205 may have a voltage V, where V typically exceeds the shutdown input voltage. (It should be noted that the battery voltage should generally equal or exceed the shutdown input voltage in order for the circuit to operate.) The voltages of the first common node 215, central node 225 and system power input are all zero. In some embodiments, the voltage of these nodes and the input may be greater than zero, such as a baseline voltage less than V. Accordingly, references herein to a zero voltage should be understood to encompass a baseline voltage as well.

At time T1 a user may press the button 210 to activate the embodiment 200. This closes the gap between the first contact and second contact, thereby providing battery power and voltage to the first common node 215. This also provides power and voltage to the button status input 255, thereby signaling to the microcontroller 265 that the button 210 has been pressed. As shown in FIG. 3, at time T1 the voltage of the first common node rises approximately to the battery voltage V, because the first common node is electrically connected to the battery 205. In practice, the first common node's voltage may be somewhat less than V because the button 210 may consume some relatively small amount of voltage. For purposes of this discussion, however, such voltage loss will be ignored.

Because the voltage of the first common node 215 is non-zero at time T1, the button status input to the microcontroller 265 is likewise non-zero. Thus, the microcontroller is informed that the button has been pressed and the corresponding contact is closed.

Further, given the orientation of the diode 220, current may flow from the first common node 215 to the central node 225. The voltage at the central node 225 is likewise equal to the voltage of the first common node and battery 205, less any voltage drop across the diode 220. Given the operating voltage of the embodiment 200 and the battery voltage, such voltage drop is relatively negligible. Thus, given a battery 205 with voltage V, the voltage of the central node 225 when the button 210 is pressed is approximately V.

Raising the voltage of the central node 225 to voltage V has two effects. First, presuming V exceeds 0.4 volts, the controller 245 activates. Second, the voltage differential between the central node and ground 270 begins to charge the capacitor 230. The resistance value of the resistor 235 generally manipulates the time necessary to charge the capacitor 230 or for the capacitor's charge to decay, as known to those skilled in the art. Thus, the actual resistance value of the resistor may change as necessary for each embodiment. Likewise, the capacitance of the capacitor 230 may vary. Further, certain embodiments may omit the resistor 235 entirely.

Still at time T1, the controller 245 activates and thus outputs a regulated DC voltage at its output terminal. In the present embodiment, the output voltage of the controller 245 is approximately 3.3 volts. This voltage may vary in alternative embodiments or implementations. With the controller 245 outputting a voltage, the system power input receives the outputted non-zero voltage. Thus, the microcontroller may be informed that the controller 245 is operational. Further, the system power input may now convey power not only to the microcontroller 265, but also to the operational circuitry 275.

Because the button 215 is still pressed at time T1, the microcontroller 265 need not supply a voltage at the power hold control output 260. Accordingly, at time T0 the power hold control output typically has no voltage at the base of the transistor 240. Some embodiments, however, may activate the power hold control output (e.g., create a voltage thereon) at time T1.

Still with reference to FIGS. 2 and 3, at time T2 a user may release the button 210. Accordingly, at time T1 the button contacts open and the voltage of the first common node 215 drops to zero. Thus, the button status output voltage likewise drops to zero, informing the microcontroller 265 that the button has been released.

Although the first common node's voltage goes to zero at time T2, the central node's voltage does not. The diode 220 prevents current flow from the central node 225 to the first common node 215, effectively treating the diode 220 as an open leg of a circuit. The capacitor 230 maintains the voltage at the central node 225 above the shutdown input voltage, at least temporarily. Given sufficient time without any current flow through the central node, the capacitor would discharge and the central node's voltage would drop below the shutdown voltage.

Because the capacitor maintains the charge of the central node 225 above the shutdown input voltage at time T2, the controller 245 continues to operate. Accordingly, the controller 245 draws power from the battery 205 and outputs a DC signal with a regulated voltage at its output terminal. Thus, the system power output remains high (in this sample embodiment, at 3.3 volts) at time T2. Accordingly, the microcontroller 265 and operational circuitry 275 both continue to be powered by the embodiment 200.

As can be seen, at time T2 the button status input 255 is a zero voltage and the system power input 250 is a high voltage. The microcontroller 265 may be programmed to recognize this input combination and, in turn, may energize the power hold control output 260. By supplying voltage at the power hold control output 260 to the base of the transistor 240, the transistor may allow current flow from the converter 245 output to the central node 225 as discussed above. This, in turn, may maintain the voltage of the central node 225 at that of the converter output, and therefore above the shutdown input voltage and ensure the converter 245 does not deactivate. Further, when the transistor 240 is active in this manner the voltage across the capacitor 230 may remain relatively constant or the capacitor may charge if below its maximum voltage.

It should be noted that, after time T2, the microcontroller 265 need not keep the power hold control output 260 constantly energized (e.g., at a positive non-zero voltage). Rather, the microcontroller 265 may enter a "watchdog" mode in which it only periodically activates the transistor 240 via the power hold control output 260. The microcontroller 265 may thus reduce overall power consumption and extend the life of the battery 205. The time intervals between outputting voltage at the power hold control output 260 may vary from embodiment to embodiment, but generally are sufficiently short that the voltage of the central node 225 does not fall beneath the shutdown input voltage. Thus, the length of such intervals may depend, in part, on the capacitance of the capacitor 230. Of course, alternative embodiments may keep the power hold control output 260 constant and dispense with the aforementioned watchdog mode.

It should also be noted that the embodiment 200 may provide additional functionality if the button 210 is pressed while the converter 245 is active. Further, because the microcontroller 265 may monitor via the button status input 255 whether or not the button 210 is pressed, certain sequences of button presses may be used to signal to the microcontroller that corresponding functionality should be activated. As one example, repeatedly pressing the button 210 when the converter 245 is active may change an operating parameter of the electronic device incorporating the embodiment 200. Providing a more specific example, if the electronic device is a wireless keyboard, it may include backlighting functionality to illuminate the keys. The backlighting may be triggered and the illumination adjusted in stages by repeatedly pressing the button.

It should be appreciated that any function of the electronic device associated with the embodiment 200 may be controlled by sequences of button presses. Further, functionality may be controlled not only by sequences of presses, but also by one or more button presses of varying duration, optionally in combination with such sequences. Returning to the above example, pressing the button 210 for at least a minimum time without releasing it may instruct the microcontroller to begin a sequence of illuminating and/or dimming the backlighting. When the user releases the button, the illumination level may remain at the level present when the button was released. Accordingly, the single input 210 used in the sample embodiment 200 may control more than just a power state of the embodiment. The exact functionality controlled may vary not only with the embodiment but also with the electronic device associated with the embodiment.

In addition to the above functionality, the embodiment 200 may be deactivated by pressing and holding the button 210 for at least a preset time. This may be combined with the "press-and-hold" functionality immediately previously described in the following manner. If the button is pressed for more than X seconds but less than Y seconds and then released, the microcontroller 265 may interpret this action as a power-down signal. If, however, the button is pressed for more than Y seconds, the microcontroller 265 may interpret the button press as an instruction to access the additional functionality previously described.

Returning to FIG. 3, an example of turning off the embodiment 200 by pressing and holding the button 210 may be seen. At time T3, the user may press the button 210 to initiate a power-down sequence. At time T3, the converter 245 output remains steady at its regulated high voltage, as does the voltage of the central node 225. Since pressing the button closes the contacts, the voltage of the first common node 215 jumps from zero to V at T3.

Presume that a length of time X, as shown on FIG. 3, is the minimum time the button 210 must be pressed to initiate the power-down sequence. At some time T4 after the length of time X elapses, the user may release the button 210. Because the button was pressed for at least the minimum length of time, the microcontroller 265 is instructed to power down the embodiment 200. (Again, the microcontroller may monitor the status of the button 210 through the button status input 255.) Accordingly, upon relapse of the button at time T4, the voltage of the first common node 215 returns to zero.

Further, the microcontroller prevents any current from being transmitted along the power hold control output 260 to the base of the BJT 240. This in turn prevents current flow through the BJT from the converter 245 output to the common node 225. Accordingly, the converter output no longer maintains a constant voltage at the common node and the capacitor 230 may begin to discharge as shown on FIG. 4. Because the capacitor's charge takes some time to decay, the voltage of the common node may remain above the shutdown input voltage for a period. Accordingly, the converter may continue to operate.

At time T5, however, the voltage of the central node 225 falls below the shutdown input voltage as the capacitor 230 charge decays. (Typically, after time T4 the voltage of the central node follows the charge decay curve of the capacitor.) Thus, the converter 245 ceases operation and the voltage and current of the converter output, as well as that of the system power input, drops to zero. Therefore, at time T5 the embodiment 200 no longer provides power to the microcontroller 265 or operational circuitry 275. Thus, at time T5 and thereafter the power draw of the electronic device is minimal and the battery life may be conserved.

Accordingly, it can be seen that the embodiment 200 may begin providing power to at least some operational circuitry 275 when a button 210 is pushed once and cease providing power at approximately the time the button is again pushed.

VII. Failsafe and Inactivity Operations

The present embodiment 200 also may power down in the event that the microcontroller or electronic device fails, hangs, or otherwise becomes unresponsive. Typically, any event rendering the electronic device housing the embodiment unresponsive likewise renders the microcontroller 265 unresponsive. The microcontroller, when unresponsive, may not output a current across the power hold control output 260. This, in turn, de-energizes the transistor 240 and initiates a shut-down sequence automatically with the effects discussed with respect to time T4 of FIG. 3.

Likewise, the microcontroller may be operationally connected to various inputs of the electronic device. If the electronic device is idle for a minimum period of time, the microcontroller may detect this lack of activity and initiate the power-down sequence. Further, the electronic device may be deactivated, thus deactivating the embodiment 200, by a user-initiated command or a command initiated by another electronic apparatus associated with the present electronic device. As an example, the embodiment 200 may be contained within a wireless keyboard and a button pressed to power down the keyboard. As a further example, a command may be transmitted from a computer associated with the wireless keyboard to power down the keyboard, for example during power-down operations of the computer itself.

VIII. Conclusion

Although the embodiments disclosed herein have been discussed in terms of particular functions, features and elements, it will be readily apparent that certain functions, features and/or elements may be added, omitted or changed without affecting the spirit or scope of the invention. As one example, certain embodiments may replace the button 210 with a microswitch. As yet another example, the various analog circuit elements disclosed herein may be replaced with digital circuit elements. Further, the sample circuit shown in FIG. 2 may be implemented as an integrated circuit, system on chip, application specific integrated circuit and so forth. As yet another example, the functionality controlled by pressing and/or releasing the button may include wireless transmission (including scaling the strength of transmission), volume or brightness of an electronic device of device's system, and so on. Accordingly, it should be appreciated that the proper scope of this document is set forth in the claims.

I claim:

1. A method for supplying power to a device, comprising the operations of:
    closing a contact;
    in response to closing the contact, activating a power converter;
    in response to activating the power converter, supplying an output voltage;
    raising a voltage of a node above a shutdown voltage, wherein raising the voltage of the node charges a capacitor connected to the node; and
    maintaining the output voltage so long as the node voltage exceeds the shutdown voltage.

2. The method of claim 1, wherein the operation of raising a voltage of a node above a shutdown voltage comprises:
    activating a transistor, thereby permitting the voltage of the node to approximately equal the output voltage.

3. The method of claim 2, wherein the operation of activating the transistor comprises:
    determining the contact is open;
    detecting the output voltage; and
    in response to both determining the contact is open and detecting the output voltage, activating the transistor.

4. The method of claim 3, wherein the operation of, in response to closing the contact, activating a power converter comprises:
    supplying power from a power source to the capacitor, thereby at least partially charging the capacitor; and
    maintaining, via the capacitor, the node voltage above the shutdown voltage at least until the transistor is activated.

5. The method of claim 2, further comprising the operations of:
    opening the contact;
    closing the contact a second time for at least a minimum time; and
    after the minimum time, deactivating the transistor.

6. The method of claim 1, further comprising the operations of:
    opening the contact;
    closing the contact a second time for at least a minimum time; and
    after the minimum time, initiating a function associated with the device.

7. A method for supplying power to a device, comprising the operations of:
    closing a contact;
    in response to closing the contact, activating a power converter;
    in response to activating the power converter, supplying an output voltage;
    raising a voltage of a node above a shutdown voltage;
    maintaining the output voltage so long as the node voltage exceeds the shutdown voltage;
    opening the contact;
    closing the contact a second time for at least a minimum time; and
    after the minimum time, initiating a function associated with the device.

* * * * *